United States Patent
Newman

(10) Patent No.: US 7,478,741 B1
(45) Date of Patent: Jan. 20, 2009

(54) SOLDER INTERCONNECT INTEGRITY MONITOR

(75) Inventor: Keith G. Newman, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 95 days.

(21) Appl. No.: 11/195,477

(22) Filed: Aug. 2, 2005

(51) Int. Cl.
*B23K 31/12* (2006.01)

(52) U.S. Cl. .................. 228/103; 228/102; 228/104

(58) Field of Classification Search ............. 228/102, 228/103, 56.5, 104; 324/765
See application file for complete search history.

(56) References Cited

U.S. PATENT DOCUMENTS

| | | | | |
|---|---|---|---|---|
| 3,871,014 A | * | 3/1975 | King et al. ............. | 257/779 |
| 3,871,015 A | * | 3/1975 | Lin et al. ............... | 257/779 |
| 5,059,897 A | * | 10/1991 | Aton et al. ............. | 324/538 |
| 5,420,500 A | * | 5/1995 | Kerschner .............. | 324/72.5 |
| 6,179,935 B1 | * | 1/2001 | Yamashita et al. ...... | 148/400 |
| 6,449,748 B1 | * | 9/2002 | Jeng et al. .............. | 716/4 |
| 6,452,502 B1 | * | 9/2002 | Dishongh et al. ....... | 340/653 |
| 6,564,986 B1 | * | 5/2003 | Hsieh .................... | 228/103 |

\* cited by examiner

*Primary Examiner*—Kevin P Kerns
*Assistant Examiner*—Michael Aboagye
(74) *Attorney, Agent, or Firm*—Dorsey & Whitney LLP

(57) ABSTRACT

An apparatus and method for non-destructive solder interconnect integrity monitoring that can detect existing fracture damage, identify new or incipient fractures, and be implemented across multiple component configurations. Said components can be implemented to detect, on a continuous basis, solder interconnect fractures as they occur during actual end-use, throughout the lifecycle of monitored components, rather than relying on a one-time electrical check prior to shipment.

24 Claims, 9 Drawing Sheets

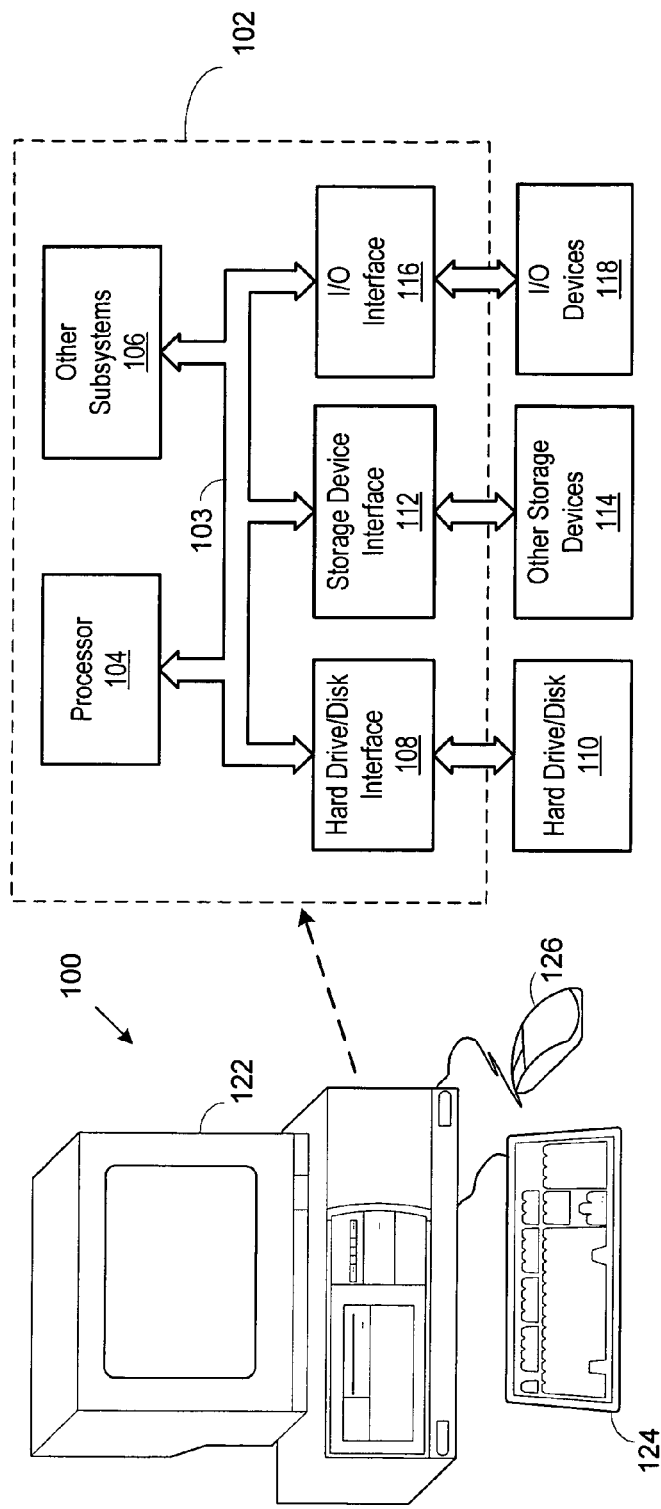
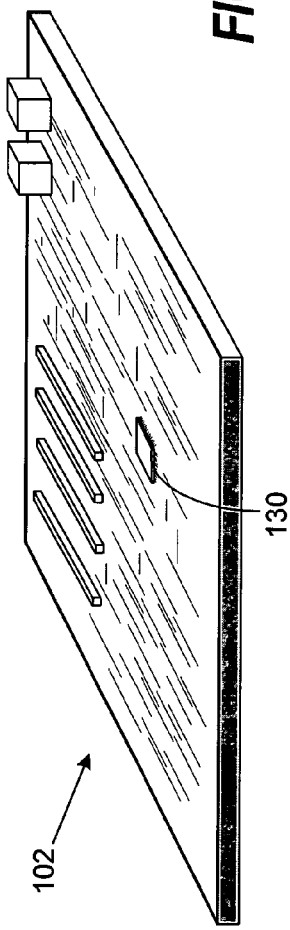

SOLDER INTERCONNECT INTEGRITY MONITOR

BACKGROUND OF THE INVENTION

1. Field of the Invention

The present invention relates in general to the field of packaging integrated circuits, and more specifically, to detecting solder interconnect fractures as they occur during the lifecycle of monitored components.

2. Description of the Related Art

Integrated circuit technology continues to evolve, resulting in chips with increased clock speeds, higher power consumption, and larger numbers of inputs and outputs. Corresponding advances in integrated circuit fabrication technology have resulted in higher levels of integration, increased density, and growth in die sizes, any or all of which can pose additional challenges when packaging and mounting semiconductor devices.

A semiconductor device is an integrated circuit in packaged form, usually mounted to a printed wire board (PWB) or other type of carrier, operating as a processing unit, memory, controller or any other electronic device. Semiconductor package and packaging techniques are designed to protect the integrated circuit from mechanical and environmental damage, assist thermal dissipation during operation, and most relevant to the present invention, provide electrical connection between the integrated circuit and external electrical devices.

A fundamental problem in semiconductor package mounting is brittle solder joint fractures. Unlike fatigue failures, these fractures typically occur during a monotonic (non-reversing) stress event such as drop or high strain rate flexure. Monotonic stress events can occur during board assembly/test, shipment/handling operations, and/or actual end-use. For example, in-circuit test (ICT) and certain assembly operations, such as manual connector insertion and printed wire board (PWB) edge-guide snap-off, are often associated with high strain and strain-rate. Such operations can also result in high PWB flexural loading, depending upon system configuration, assembly location, and other factors. Because the method and apparatus of the present invention can be used with a wide variety of solder-based electrical connections and associated geometries, the terms "solder joint" and "solder interconnect" will be used interchangeably.

Although they occur infrequently, brittle solder interconnect fractures are nonetheless a major concern given the possibility of undetected failures. Some brittle solder joint fractures may be detected prior to shipment, while others may go undetected due to either incomplete fracture of the solder joint, or ohmic contact between fractured surfaces during electrical monitoring. The presence of undetected, yet damaged, solder joints compromises the potential functionality and reliability of the electronic device during end-use operation.

While brittle fractures have been documented for ball grid array (BGA) packages using electrolytic nickel/gold (Ni/Au)-plated and solder-over-copper (Cu) substrates, the majority of brittle fractures involve packages using electroless nickel, immersion gold (ENIG) plated BGA substrates. Brittle fracture for BGA packages using ENIG plating occurs between the phosphorous (P) rich Ni surface and the nickel-tin/tin-copper/nickel (NiSn/SnCu/Ni) intermetallic layer. Approaches for the prevention of BGA brittle fracture can include improvement in solder joint fracture resistance, as well as reduction of applied strain.

Solder joint fracture resistance can also be dependent upon the characteristics of the solder used in assembly. For example, the strength characteristics of SnPb (tin-lead) and Pb-free solder alloys are highly strain-rate dependent, but Pb-free solder alloys, such as tin-gold-copper (SnAgCu), may prove more sensitive to brittle fracture than eutectic SnPb solder. Although solder strength typically improves with increased strain-rate, the higher plastic modulus at elevated strain levels can result in increased interfacial strain at the pad/solder region under flexural or impact loading conditions.

Currently, various destructive tests including drop, shock, vibration, twist, and high-speed monotonic bend, are used to correlate fracture resistance to force, deflection, and/or acceleration. When applied at the component and board level, these tests can be useful for assessing the integrity of solder joints resulting from different combinations of components and/or assembly processes. Other destructive solder joint integrity test methods approximate actual conditions associated with solder joint brittle fracture and can yield more accurate assessments of brittle fracture resistance. For example, solder interconnect brittle fracture resistance during drop conditions can be characterized using drop testing of production and/or test circuit board assemblies. A destructive industry test method used to assess BGA solder joint integrity, solder ball shear/pull testing, does not consistently detect microstructural weaknesses at the pad/solder interfaces where brittle failures occur. Furthermore, solder ball shear and/or pull testing is not applicable to BGA components assembled on a PWB.

While these destructive test methods provide useful tools for component manufacturers to optimize the brittle fracture resistance of their product, they are impractical for in-line solder joint integrity monitoring and/or end-use, either of which require a non-destructive testing approach. Furthermore, the results of these destructive tests are only applicable to the specific component and board configuration under test.

What is needed is a non-destructive solder joint integrity monitoring system that can detect existing damage, identify new or incipient fractures, and is capable of being implemented across multiple component configurations.

SUMMARY OF THE INVENTION

In accordance with the present invention, the method and apparatus for monitoring solder interconnect package connections is set forth, which provides a non-destructive method of detecting brittle solder joint fractures, as they occur, throughout the lifecycle of the monitored components. Skilled practitioners of the art are aware that brittle solder joint fractures typically occur at a device's outermost solder joints, which correspond to areas of maximum strain.

In one embodiment of the invention, corner solder joints of a device are implemented with printed wiring board (PWB) circuitry to provide a continuous, electrical, solder joint integrity monitor, allowing both detection of existing damage, as well as indicating new or incipient fractures. In different embodiments of the invention, the method of electrical monitoring can be implemented to perform predetermined continuity tests ranging from simple discontinuity to glitch detection. Any predetermined number of outer solder joints in the package can be used to monitor the integrity of the remaining solder joints. For example, one or more corner solder joints may be implemented as monitoring pins, assigned a voltage level, and monitored during device operation through associated PWB circuitry. In different embodiments of the invention, the number of solder joints implemented as monitoring pins can range from a single solder joint per device, to a plurality of solder joints.

In one embodiment of the invention, predetermined solder joints serving as monitoring pins may be constructed to fail at different loading conditions within a single device, allowing quantifiable measurement of the applied damaging load, while also providing notification of damaging events. For example, in different embodiments of the invention, the configuration of predetermined solder joints can range from an exact duplicate of surrounding functional package balls/pins/ leads, to a highly modified geometry designed to provide more sensitivity or varied response levels. In other embodiments of the invention, these predetermined solder joints can be modified by altering their respective construction, (e.g., reducing the size of package pads and/or PWB lands at monitoring pin locations) so they fail sooner than the remaining functional solder joints.

Those skilled in the art will recognize that different embodiments of the invention may comprise multiple monitoring pin implementations. For example, in different embodiments of the invention, predetermined monitoring pins may be comprised of solder interconnects comprising solder of predetermined, but differing, compositions (e.g., various SnPb and Pb-free alloys), each of which will typically fracture at different strain rate levels. Similarly, it will be understood by those of skill in the art that monitoring pins may be comprised of solder attached leadframe, solder coated land pad, solder coated metallic or organic sphere, or other configurations. As will be apparent to those skilled in the art, the method and apparatus of the invention is not limited to grid array style semiconductor devices, but can also be implemented for peripheral leadframe, and other semiconductor package geometries.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 1 illustrates a computer system in accordance with an embodiment of the present invention.

FIG. 1 illustrates a computer system in accordance with an embodiment of the present invention.

DETAILED DESCRIPTION

Figure 2:
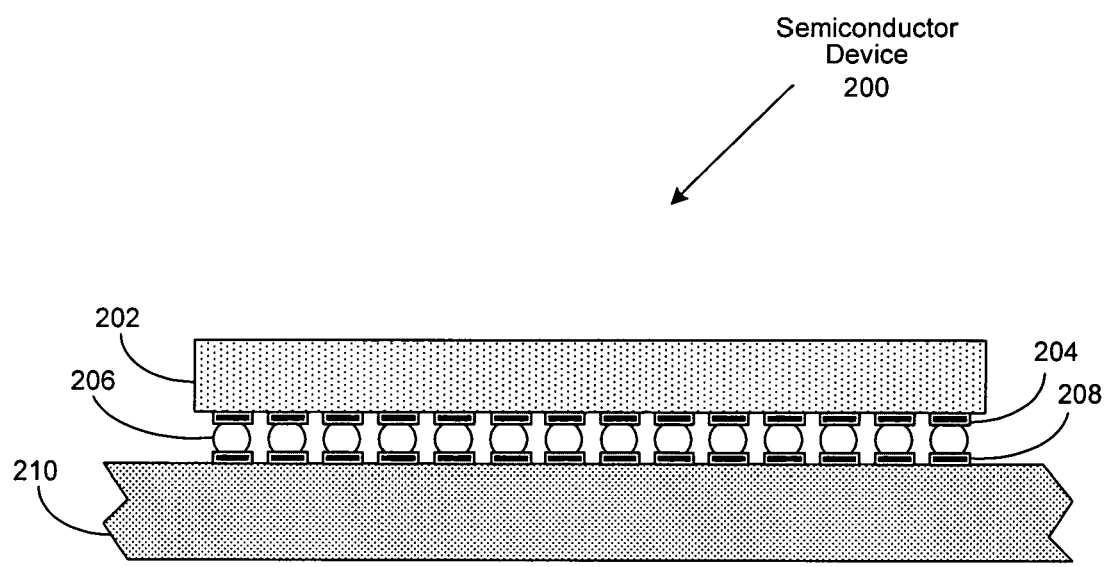
FIG. 2 illustrates a semiconductor device mounted in a package comprising a ball grid array (BGA).

The method and apparatus of the present invention provides significant improvements in the electronic devices such as those used in a computer system 100 shown in FIG. 1A. The computer system 100 includes a main system board 102 that comprises a plurality of integrated circuits, such as a processor 104 and integrated circuits used for various other subsystems 106 understood by those skilled in the art. Data is transferred between the various system components via various data buses illustrated generally by bus 103. A hard drive 110 is controlled by a hard drive/disk interface 108 that is operably connected to the hard drive/disk 110. Likewise, data transfer between the system components and other storage devices 114 is controlled by storage device interface 112 that is operably connected to the various other storage devices 114, such as CD ROM drives, floppy drives, etc. An input/ output (I/O) interface 118 controls the transfer of data between the various system components and a plurality of input/output (I/O) devices, such as a display 122, a keyboard 124, a mouse 126.

For purposes of this disclosure, the present invention is described in the context of computer system 100 illustrated in FIG. 1A. However, the present invention can be used to improve electrical connections on any type of electronic device. Hence, the present invention is not limited to the computer system 100 illustrated in FIG. 1A.

FIG. 1B is a generalized illustration of a printed circuit board such as system board (or motherboard) 102 discussed above in connection with FIG. 1A. Circuit boards, such as the circuit board 102 shown in FIG. 1B, generally have numerous integrated circuits 130 that are coupled to connectors on the board with solder connections, such as solder ball joints.

FIG. 2 is a generalized illustration of a semiconductor device 200 mounted in a package 202, comprising a ball grid array (BGA) of solder ball joints 206, which provides physical and electrical connectivity between the pads 204 of package 202, and the lands 208 of circuit board 210.

Figure 3:
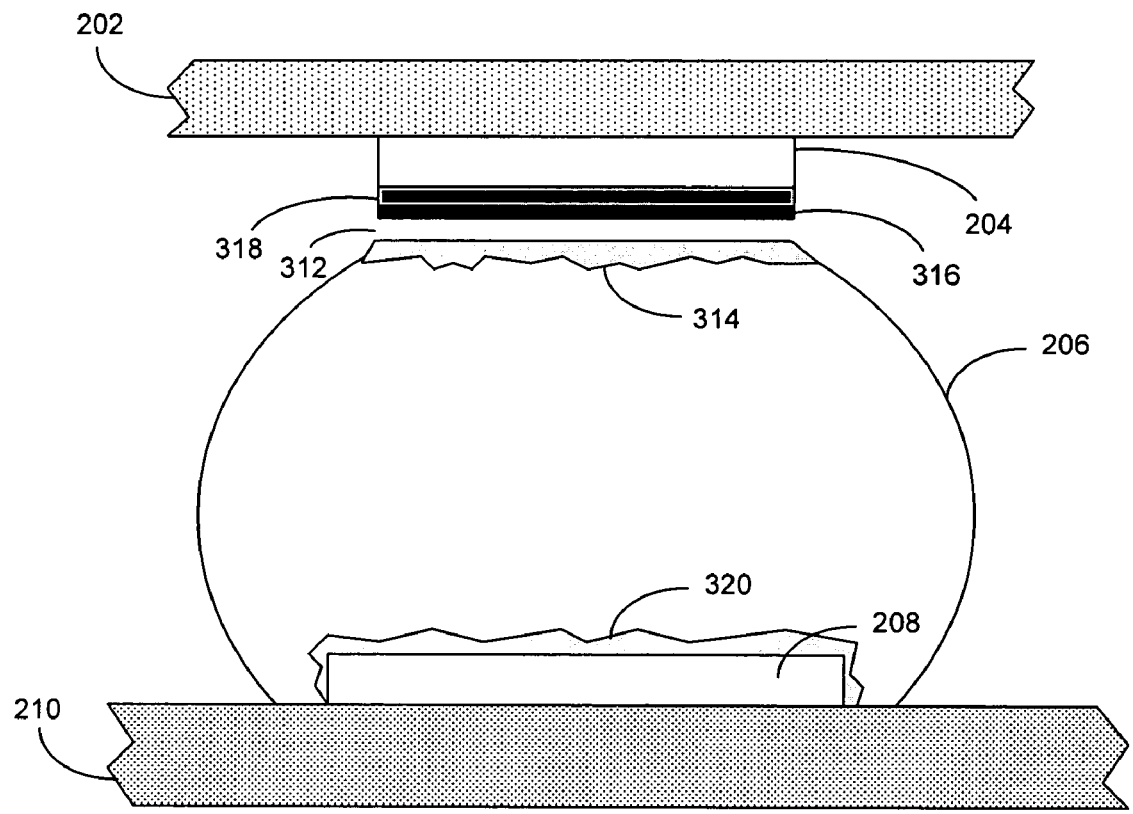
FIG. 3 illustrates a BGA brittle solder joint fracture.

FIG. 3 is a generalized illustration of a BGA brittle solder joint fracture. More specifically, semiconductor package 202 is comprised of copper (Cu) pad 204, which comprises a nickel-phosphorus (Ni—P) plated surface 318, which comprises a phosphorus-rich (P+) layer 316. Solder ball 206 is bonded to CU land 208 of circuit board 210 through copper-tin (CuSn) intermetallic layer 320. As illustrated, BGA brittle solder joint fractures 312 typically occur between phosphorus-rich (P+) layer 316 and nickel-tin (NiSn) and/or tin-copper-nickel (SnCuNi) layer 314 of solder ball 206. In some cases, BGA brittle solder joint fractures can occur between CuSn intermetallic layer 320 and Cu land 208 of circuit board 210. As will be understood by those of skill in the art, different compositions of solder may also lead to brittle solder joint failure under certain mechanical stresses.

Figure 4A:
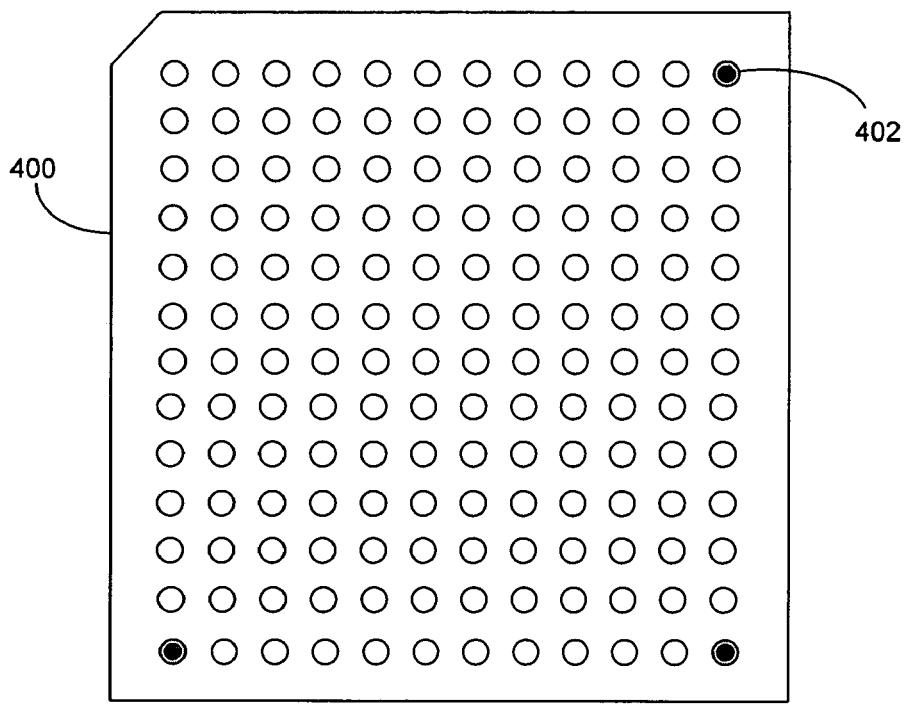
FIG. 4a shows one method of an embodiment of the invention where a single, corner solder joint is used as a monitoring pin to detect brittle solder joint fractures.

FIG. 4a shows one method of an embodiment of the invention where a single, predetermined corner solder joint 402 of a semiconductor package BGA 400 is used as a monitoring pin to detect brittle solder joint fractures.

Figure 4B:
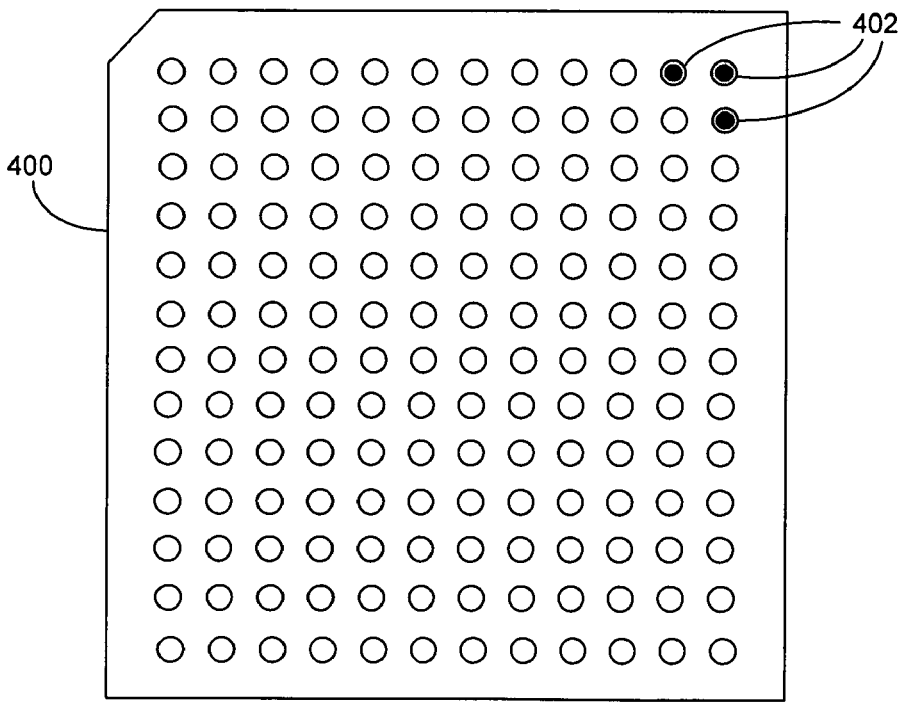
FIG. 4b shows one method of an embodiment of the invention where multiple solder joints in one corner are used as monitoring pins.

FIG. 4b shows one method of an embodiment of the invention where a predetermined number of solder joints 402 in one corner of a semiconductor package BGA 400 are used as monitoring pins to detect brittle solder joint fractures.

Figure 4C:
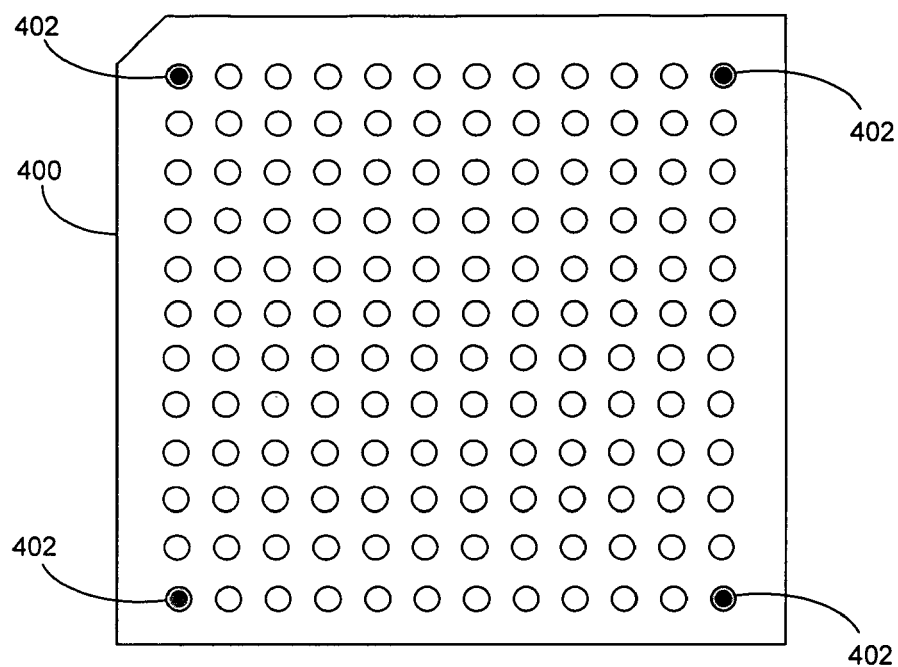
FIG. 4c shows one method of an embodiment of the invention where a single solder joint in each corner is used as a monitoring pin.

FIG. 4c shows one method of an embodiment of the invention where a single, predetermined solder joint 402 in each corner of a semiconductor package BGA 400 is used as a monitoring pin to detect brittle solder joint fractures.

Figure 4D:
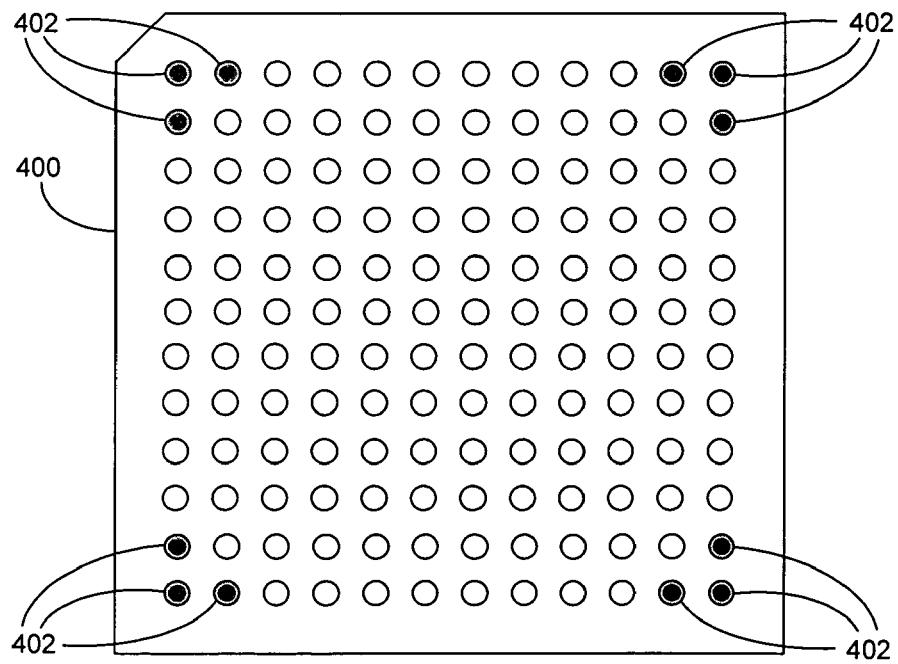
FIG. 4d shows one method of an embodiment of the invention where multiple solder joints are used in each corner as monitoring pins.

FIG. 4d shows one method of an embodiment of the invention where a predetermined number of solder joints 402 are used in each corner of a semiconductor package BGA 400 as monitoring pins to detect brittle solder joint fractures.

Figure 4E:
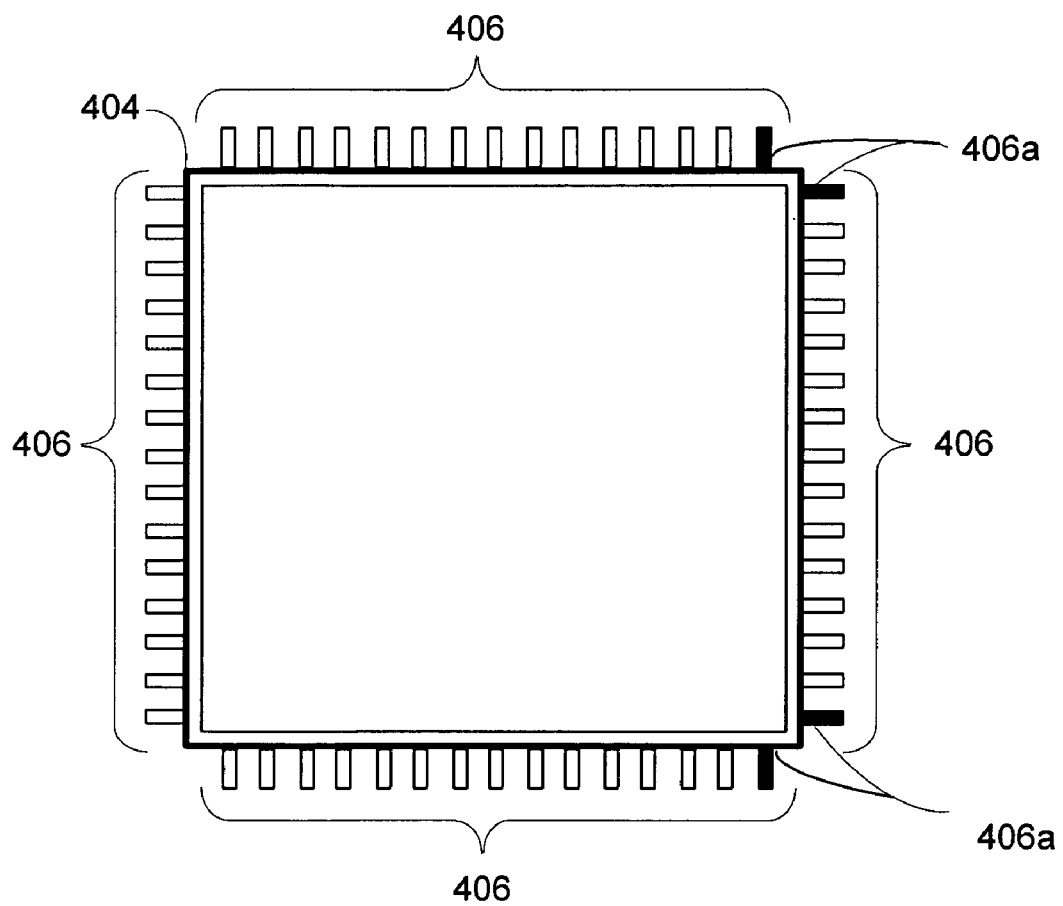
FIG. 4e is an illustration of an embodiment of the present invention wherein a plurality of peripheral solder interconnects, such as solder interconnects in a lead frame, are monitored.

FIG. 4e is an illustration of a lead frame connector 404 comprising a plurality of peripheral solder interconnects 406. Individual solder interconnects 406 can be monitored using the techniques described herein to detect brittle solder interconnect fractures. For example, solder interconnects 406a on the corners of the lead frame connector can be monitored. Alternatively, various other combinations of the solder interconnects 406 can be monitored, as discussed hereinabove in connection with FIGS. 4a-d.

Figure 5A:
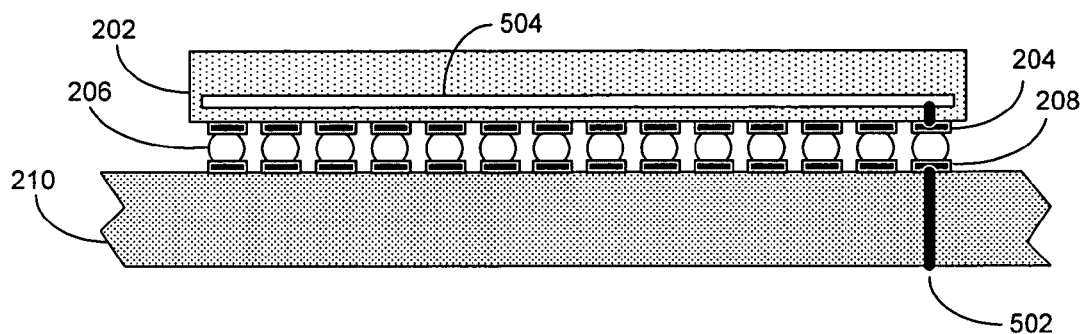
FIG. 5a shows one method of an embodiment of the invention where a single solder joint is used as a monitoring pin to detect brittle solder joint fractures.

FIG. 5a is a generalized illustration of one method of an embodiment of the invention where a semiconductor package 202, which comprises a ball grid array (BGA) of solder ball joints 206, which provide physical and electrical connectivity between the pads 204 of package 202 and the lands 208 of circuit board 210. Semiconductor package 202 comprises electrical trace 504, which couples to package pad 204, providing electrical circuit continuity through solder ball joint 206, and circuit board pad 208, to a single monitoring pin 502. In this same embodiment, loss of circuit continuity through monitoring pin 502 can indicate a brittle fracture of solder joint 206 coupled to monitoring pin 502, and the possibility of other brittle solder joint fractures.

Figure 5B:
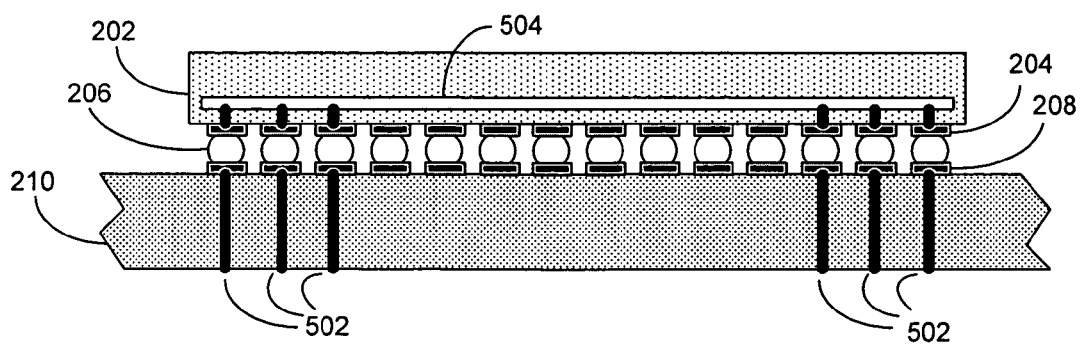
FIG. 5b shows one method of an embodiment of the invention where multiple solder joints are used in each corner as monitoring pins.

FIG. 5b is a generalized illustration of one method of an embodiment of the invention where a semiconductor package 202, which comprises a ball grid array (BGA) of solder ball joints 206, which provide physical and electrical connectivity between the pads 204 of package 202 and the lands 208 of circuit board 210. Semiconductor package 202 comprises electrical trace 504, which couples to a plurality of package pads 204, providing electrical circuit continuity through a plurality of solder ball joints 206, and circuit board lands 208, to a plurality of monitoring pins 502. In this same embodiment, loss of circuit continuity through monitoring pins 502 can indicate a brittle fracture of one or more solder joints.

Figure 5C:
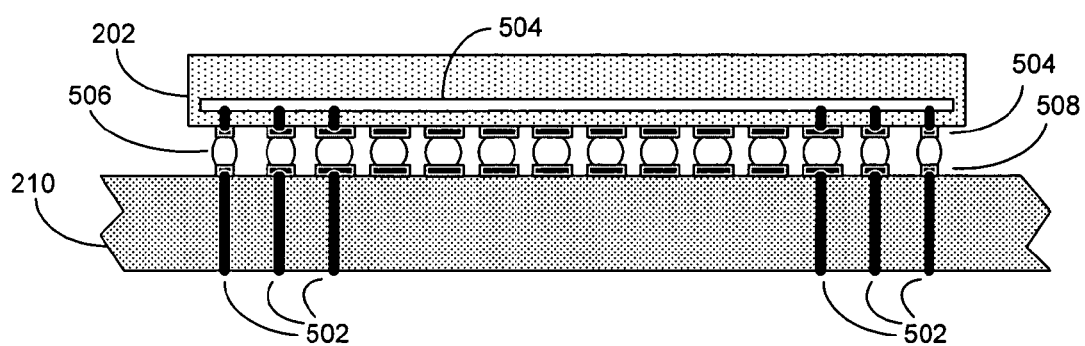
FIG. 5c shows one method of an embodiment of the invention where multiple solder joints, each with different physical characteristics, are used as monitoring pins.

FIG. 5c is a generalized illustration of one method of an embodiment of the invention where a semiconductor package 202, which comprises a ball grid array (BGA) of solder ball joints 206, which provide physical and electrical connectivity between the pads 204 of package 202 and the lands 208 of circuit board 210. Semiconductor package 202 comprises electrical trace 504, which couples to a plurality of package pads 204, providing electrical circuit continuity through a plurality of solder ball joints 206, and circuit board lands 208, to a plurality of monitoring pins 502.

In this method of the embodiment of the invention, the configuration of predetermined solder joints 506 can range from an exact duplicate of surrounding functional solder joints 506, to a highly modified geometry designed to provide more sensitivity or varied response levels. In this embodiment of the invention, these predetermined solder joints 506 can be modified by altering their respective construction, (e.g., reducing the size of package pads 504 and/or PWB lands 508 at monitoring pin locations 502) so they fail sooner than the remaining functional solder joints. In this same embodiment, loss of circuit continuity through monitoring pins 502 can indicate a brittle fracture of one or more solder joints. Those with skill in the art will recognize that an early brittle fracture detection system can be implemented by coupling solder joints that fracture at lower strain levels to monitoring pins.

Figure 5D:
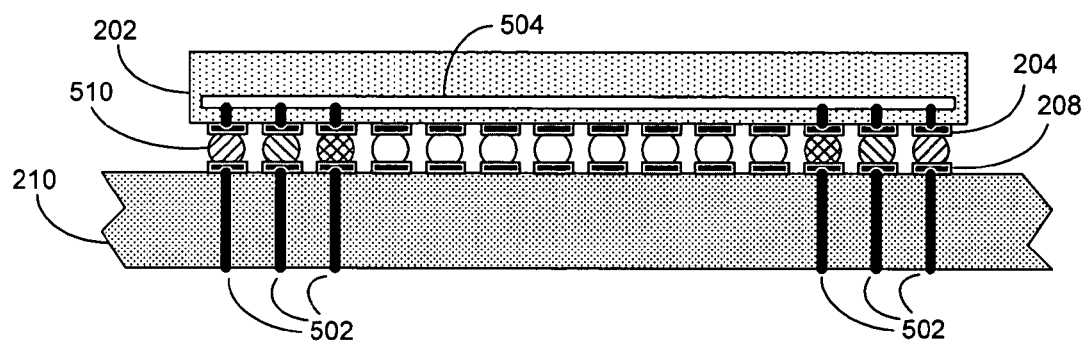
FIG. 5d shows one method of an embodiment of the invention where multiple solder joints, each with different solder compositions, are used as monitoring pins.

FIG. 5d is a generalized illustration of one method of an embodiment of the invention where a semiconductor package 202, which comprises a ball grid array (BGA) of solder ball joints 206, which provide physical and electrical connectivity between the pads 204 of package 202 and the lands 208 of circuit board 210. Semiconductor package 202 comprises electrical trace 504, which couples to a plurality of package pads 204, providing electrical circuit continuity through a plurality of solder ball joints 206, and circuit board lands 208, to a plurality of monitoring pins 502.

In this embodiment of the invention, predetermined monitoring pins 502 may be comprised of solder balls 510 comprising solder of predetermined, but differing, compositions (e.g., various SnPb and Pb-free alloys), each of which will typically fracture at different strain levels. Depending upon the specific strain and strain-rate conditions, common solder alloys like eutectic SnPb solder (63% Sn, 37% Pb) may be less susceptible to fracture than Pb-free solder alloys such as Sn3Ag0.5Cu (96.5% Sn, 3% Ag, 0.5% Cu). Additional solder alloy examples of differing brittle fracture resistance include SnPb10 (90% Sn, 10% Pb), SnAg3.4Bi4.8 (91.8% Sn, 3.4% Ag, 4.8% Bi), and SnAg2.5Bi1.0Cu0.5 (96% Sn, 2.5% Ag, 1% Bi, 0.5% Cu). Other embodiments of the invention can be implemented with tin coated copper balls or organic balls with metallic coatings.

In this embodiment, loss of circuit continuity through monitoring pins 502 can indicate a brittle fracture of one or more solder interconnections. In one embodiment of the present invention, an early brittle fracture detection system can be implemented by coupling solder joints that fracture at lower strain levels to monitoring pins.

Figure 6:
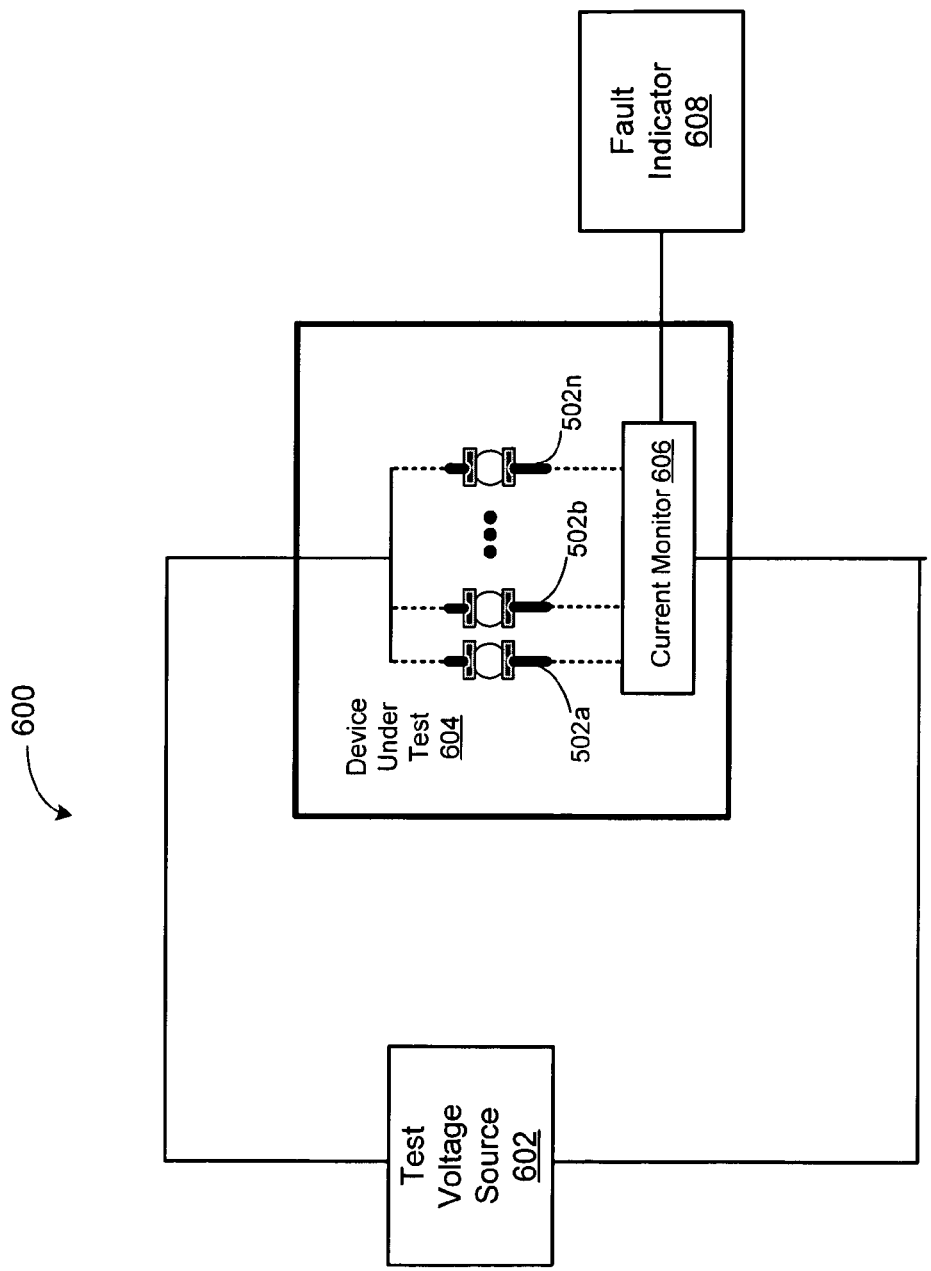
FIG. 6 is a generalized illustration of the functional components of an embodiment of a testing system for detecting failure of a solder interconnect in accordance with the present invention.

FIG. 6 is a generalized illustration of the functional components of a testing and monitoring system 600 that can be used to monitor solder interconnects in accordance with the present invention. The testing and monitoring system 600 comprises a test voltage source 602 that provides a voltage across the terminals of the solder interconnects 502a, 502b, . . . , 502n, of the device under test 604. A current monitor 606 is operable to monitor the current through the various solder interconnects, 502a, 502b, . . . , 502n and to provide a "fault detected" signal to a fault indicator 608. As will be appreciated by those of skill in the art, the various functional components illustrated in FIG. 6 can be implemented as part of a computer system or other electronic device. Alternatively, the functional components illustrated in FIG. 6 can be implemented in a stand-alone test system.

Those of skill in the art will recognize that different embodiments of the invention may comprise multiple monitoring pin implementations. Similarly, it will be understood by those skilled in the art, that monitoring pins may be comprised of solder attached leadframe, solder coated land pad, solder coated metallic or organic sphere, or other configurations. As will also be apparent to those skilled in the art, the method and apparatus of the invention is not limited to grid array style semiconductor devices, but can also be implemented for peripheral leadframe, and other semiconductor package geometries.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Those skilled in the art will understand that the integrity of device solder joints in end-use operation is generally unknown. Fractures may exist that manifest their existence by intermittent electrical events that are difficult to isolate, without physical de-construction of the assembly. Use of the invention will insure, at a minimum, that solder joint fractures can be detected as they occur throughout the lifecycle of monitored components. Further, the invention monitors solder joint integrity on a continuous basis during actual end-use, across a plurality of component combinations and system configurations, rather than relying on a one-time electrical check prior to shipment. In addition, the present invention provides a method to assess whether excessive mechanical strain has been imposed on a circuit board assembly.

Although the present invention has been described in detail, it should be understood that various changes, substitutions and alterations can be made hereto without departing from the spirit and scope of the invention as defined by the appended claims.

What is claimed is:

1. A method of monitoring a solder interconnect, comprising:
   providing electrical current to at least one first solder interconnect within an array of solder interconnects, the at least one first solder interconnect configured differently from the array of solder interconnects such that the at least one first solder interconnect will fail sooner than the array of solder interconnects; and
   monitoring said current operable to detect loss of current in said at least one first solder interconnect indicating a failure of said at least one first solder interconnect, wherein said at least one first solder interconnect is formed from solder having a composition with a fracture strength different than the fracture strength of solder interconnects within the array of solder interconnects.

2. The method of claim 1, wherein said at least one first solder interconnect is an outer peripheral solder interconnect within said array of solder interconnects.

3. The method of claim 1, wherein said at least one first solder interconnect is located at a corner of said array of solder interconnects.

4. The method of claim 1, further comprising correlating failure of said at least one first solder interconnect with the functional condition of other solder interconnects in said array of solder interconnects.

5. The method of claim 1, wherein said at least one first solder interconnect is one of a plurality of solder interconnects and further comprising monitoring said plurality of solder interconnects to determine the functional condition of other solder interconnects in said array of solder interconnects.

6. The method of claim 5, further comprising continuously monitoring the plurality of solder interconnects during the operation of an integrated circuit having electrical connectors attached to said solder interconnect array.

7. A method of monitoring a solder interconnect, comprising:
   providing electrical current to at least one first solder interconnect within an array of solder interconnects, the at least one first solder interconnect configured differently from the array of solder interconnects such that the at least one first solder interconnect will fail sooner than the array of solder interconnects; and
   monitoring said current operable to detect loss of current in said at least one first solder interconnect indicating a failure of said at least one first solder interconnect, wherein said at least one solder interconnect has a different geometry than the array of solder interconnects.

8. The method of claim 7, wherein a selected set of solder interconnects within said at least one solder interconnect have geometries selected to cause the respective solder interconnects to fail in a predetermined sequence that can be correlated with increasing strain on said array of solder interconnects.

9. The method of claim 8, wherein said different geometries are selected to correlate failure of said selected set of solder interconnects with stress applied to said array.

10. The method of claim 9, wherein said selected set of solder interconnects are disposed at locations correlated with increased strain on a printed wiring board.

11. The method of claim 7, further comprising continuously monitoring the plurality of solder interconnects during the operation of an integrated circuit having electrical connectors attached to said solder interconnect array.

12. A solder interconnect monitoring system, comprising:
    at least one first solder interconnect within an array of solder interconnects, the at least one first solder interconnect structured differently from the array of solder interconnects such that the at least one first solder interconnect will fail sooner than the array of solder interconnects;
    conductors providing electrical current to said at least one first solder interconnect; and
    a current monitor operable to detect loss of current in said at least one first solder interconnect indicating a failure of said solder interconnect, wherein said at least one first solder interconnect is formed from solder having a composition with a fracture strength different than the fracture strength of the array of solder interconnects.

13. The monitoring system of claim 12, wherein said at least one first solder interconnect is an outer peripheral solder interconnect within said array of solder interconnects.

14. The monitoring system of claim 12, wherein said at least one first solder interconnect is located at a corner of said array of solder interconnects.

15. The monitoring system of claim 12, wherein said monitoring system is operable to correlate failure of said at least one first solder interconnect with the functional condition of other solder interconnects in said array of solder interconnects.

16. The monitoring system of claim 12, wherein said at least one first solder interconnect is one of a plurality of solder interconnects that said monitoring system is configured to monitor to determine the functional condition of other solder interconnects in said array of solder interconnects.

17. The monitoring system of claim 16, wherein said monitoring system is configured to monitor said monitored solder interconnects continuously during the operation of an integrated circuit having electrical connectors attached to said solder interconnect array.

18. A solder interconnect monitoring system, comprising:
at least one first solder interconnect within an array of solder interconnects, the at least one first solder interconnect structured differently from the array of solder interconnects such that the at least one first solder interconnect will fail sooner than the array of solder interconnects;
conductors providing electrical current to said at least one first solder interconnect; and
a current monitor operable to detect loss of current in said at least one first solder interconnect indicating a failure of said solder interconnect, wherein said at least one first solder interconnect is formed with a different geometry than the array of solder interconnects.

19. The monitoring system of claim 18, wherein a selected set of solder interconnects within said at least one solder interconnect have geometries selected to cause the respective solder interconnects to fail in a predetermined sequence that can be correlated with increasing strain on said solder interconnect array.

20. The monitoring system of claim 18, wherein said different geometries of said individual solder interconnects within said at least one solder interconnect are selected to correlate failure of said at least one solder interconnect with stress applied to said solder interconnect array.

21. The monitoring system of claim 19, wherein said at least one solder interconnect is disposed at least one location correlated with increased strain on a printed wiring board.

22. The monitoring system of claim 18, wherein said monitoring system is operable to correlate failure of said at least one first solder interconnect with the functional condition of other solder interconnects in said array of solder interconnects.

23. The monitoring system of claim 18, wherein said at least one first solder interconnect is one of a plurality of solder interconnects that said monitoring system is configured to monitor to determine the functional condition of other solder interconnects in said array of solder interconnects.

24. The monitoring system of claim 23, wherein said monitoring system is configured to monitor said monitored solder interconnects continuously during the operation of an integrated circuit having electrical connectors attached to said solder interconnect array.

* * * * *